US012702075B2

(12) United States Patent
Gerets et al.

(10) Patent No.: US 12,702,075 B2
(45) Date of Patent: Aug. 4, 2026

(54) LIGHT EMITTING MODULES WITH OPTICAL DATA TRANSMISSION

(71) Applicant: BARCO N.V., Kortrijk (BE)

(72) Inventors: Peter Gerets, Roeselare (BE); Patrick Willem, Ostend (BE); Bart Van Den Bossche, Marke (BE); Wim Van Eessen, Kruishoutem (BE)

(73) Assignee: BARCO N.V., Kortrijk (BE)

( * ) Notice: Subject to any disclaimer, the term of this patent is extended or adjusted under 35 U.S.C. 154(b) by 406 days.

(21) Appl. No.: 18/572,240

(22) PCT Filed: Jun. 30, 2022

(86) PCT No.: PCT/EP2022/068024
§ 371 (c)(1),
(2) Date: Dec. 20, 2023

(87) PCT Pub. No.: WO2023/275220
PCT Pub. Date: Jan. 5, 2023

(65) Prior Publication Data
US 2024/0290765 A1 Aug. 29, 2024

(30) Foreign Application Priority Data

Jun. 30, 2021 (LU) .................................. LU500363

(51) Int. Cl.
*H10W 90/00* (2026.01)
*H10F 55/25* (2025.01)

(52) U.S. Cl.
CPC ............ *H10W 90/00* (2026.01); *H10F 55/25* (2025.01)

(58) Field of Classification Search
None
See application file for complete search history.

(56) References Cited

U.S. PATENT DOCUMENTS 7,071,894 B1 7/2006 Thielemans et al.
7,176,861 B2 2/2007 Dedene et al.
(Continued)

FOREIGN PATENT DOCUMENTS

EP 3605510 2/2020
WO 2015079058 6/2015

OTHER PUBLICATIONS

Office Action issued in Taiwanese Application No. 111124367, mailed Feb. 5, 2026, with English machine translation.
(Continued)

*Primary Examiner* — Sue A Purvis
*Assistant Examiner* — Jordan M Klein
(74) *Attorney, Agent, or Firm* — HSML P.C.

(57) ABSTRACT

A light emitting module including a first surface having a plurality of light emitting elements, a second surface configured to receive driving signals and to transfer these signals to the light emitting elements of the first surface. The second surface includes a plurality of optical transmitters, in which the optical transmitters are each associated to an associated optical receiver arranged on the first surface, the optical transmitter and the associated opposing optical receiver being separated by an optical medium, such that an optical signal including driving signals transmitted by the optical transmitter is received by the opposing optical receiver, each optical receiver being connected to at least one light emitting element and is configured to transform the optical signal into an electrical signal configured to drive the at least one light emitting element to generate an image on the display.

22 Claims, 8 Drawing Sheets

7000

(56) References Cited

U.S. PATENT DOCUMENTS

| | | | |
|---|---|---|---|
| 7,450,085 B2 | 11/2008 | Thielemans et al. | |
| 7,972,032 B2 | 7/2011 | Meersman et al. | |
| 2012/0212465 A1* | 8/2012 | White | G09G 3/30 |
| | | | 345/205 |
| 2020/0111771 A1* | 4/2020 | Su | G06F 3/1446 |
| 2021/0210567 A1* | 7/2021 | Cheng | H10K 59/65 |

OTHER PUBLICATIONS

ISR and Written Opinion for PCT/EP2022/068024 dated Oct. 10, 2022 (11 pages).

\* cited by examiner 180     250

170

7060

7200

7210

7210

7200

7170

7060

810

7180

7110

7120

LIGHT EMITTING MODULES WITH OPTICAL DATA TRANSMISSION

TECHNICAL FIELD

The present disclosure relates to the field of light emitting modules for light emitting displays and in particular to the transmission of signal data within the light emitting module. The light sources are usually solid-state light emitting elements, such as LEDs or micro-LEDS.

BACKGROUND

Using LEDs (Light Emitting Diodes) in display technology is already quite old. LEDs have proven to be reliable, sturdy, consistent in time, powerful and stable, hence a perfect technology for direct displays. Modern LED displays are driven in Active Matrix mode for efficiency and low cost driving, similar to how LCD liquid crystal displays are driven.

To realize such a display, TFT (Thin Film Transistor) technology is used. The LEDs are mounted on a carrier or light emitting module of a certain size, for example TFT on glass, on which electronic driving circuits are implemented (e.g., the current references for constant current drive, level shifters for voltage corrections, pipelining logic like flip-flops, shift registers, etc.).

This technology is used for high resolution displays. There is a large number of contacts which need to be routed to the rear of the light emitting module. This number of contacts depends on the level of integration of the electronics on the TFT Light emitting module, however all the connections need to be rerouted to the rear of the module. In-plane contact technology, as used in LCD panels is not usable because the Light emitting modules need to be seamlessly tiled. Hence, the space between adjacent modules for relaying the contacts from the front of the light emitting module to the rear is very limited and bound to the tolerance space between edges of the adjacent modules.

To relay the contacts from the front of the light emitting module to the rear, a galvanic side contacting technique needs to be used which needs to fit in the narrow space between adjacent Light emitting modules. WO2015079058A1 discloses a solution to dispose the conductive material of the light emitting module on the side wall to save space to make a narrower rim between adjacent light emitting modules. While this solution works well with LED displays, it is not adapted anymore to micro LEDs for example as the additional number of electrical connections to be added is consequent. In fact, the thousands of contacts at the front of the light emitting module (e.g., 40 μm wide and 2 μm thick) need to be contacted at the front and at the back, doubling the net number of contacts.

In addition to data signals, also power, reference, and ground may further need to be contacted. These contacts are usually larger and distributed over the rim of the light emitting module, thereby occupying space for the data signals.

It remains a challenge to provide a light emitting module having a narrow rim and thousands of contacts to be made to carry data signals to the light emitting elements, between the front and the back of the light emitting module, in addition to power, reference and ground.

SUMMARY

It is an object of the present invention to provide a light emitting module comprising a first surface and a second surface. The first surface comprises a plurality of light emitting elements, and the second surface is configured to receive driving signals and to transfer these signals to the light emitting elements of the first surface. The second surface further comprises a plurality of optical transmitters, wherein the optical transmitters are each associated to an optical receiver arranged on the first surface. The optical transmitter and the associated optical receiver are separated by an optical medium, such that an optical signal transmitted by the optical transmitter is received by the associated optical receiver. Each optical receiver is connected to at least one light emitting element and is configured to transform said optical signal into an electrical signal. The electrical signal is configured to drive the at least one light emitting element to generate an image for a display.

Providing optical transmitters and optical receivers allows to eliminate the galvanic connections for transmitting the data signals. It provides new means to transfer data within a light emitting module. In addition, these optical transmitters and receivers can be implemented anywhere on the first and second surface of the light emitting module. This solution only requires an optical medium between each pair of optical transmitter and optical receiver.

The optical receiver may be an optical photosensitive device. Optical photosensitive devices can be easily implemented on a TFT for example, as a transistor, similar to photosensitive devices used for fingerprint detection.

The optical transmitter may be a light emitting element, said light emitting element being preferably an LED, OLED, and variations thereof, QD-LED, EL-QLED, AMOLED, mini-LED, micro-LED, or a laser.

It is an advantage to use LEDs for the optical transmitter, as LEDs are point source light sources. In addition, LEDs are energy efficient, are compact and may provide high radiant intensity which can be easily tuned. Any spectral bandwidth is available, and the optical receiver may be easily tuned accordingly to be sensitive to the spectral bandwidth of the light emitted by the optical transmitter. In addition to the visible spectrum, IR and UV LEDs are available. LEDs may also provide a collimated beam with simple collimation optics.

The light emitting elements may be any one of LEDs, OLEDs, and variations thereof, QD-LEDs, EL-QLEDs, AMOLEDs, mini-LEDs, micro-LEDs.

While the invention has been made to provide be able to easily transfer data signals when the light emitting module is populated with thousands of micro-LEDs, the invention is not limited to micro LEDs. This new optical means to transfer signal data can be used with any type of display, as defined above.

The first surface and/or the second surface may be preferably any one of a TFT on glass, TFT on polyimide, a PCB.

The invention is also not limited to the type of surface used. However, TFT, or PCBs are often used in the field of displays. It is important that an optical medium separates the first and second surface at least at the locations of the optical receivers and transmitters. The first and second surface are preferably optically connected at those locations. Glass may also be the optical medium. Any surface, such as a PCB or TFT on a substrate, which are suitable to carry the light emitting elements and related electronics and optical receivers, for the first surface and the optical transmitters for the second surface, may be used. Thus, the first and second surface may also be provided by the same PCB, in which holes would be made at the locations of the optical receivers and transmitters. The first and second surfaces would then be the top surface and bottom surface of the PCB.

The refractive indexes of the first and second surfaces can be chosen to minimize total internal reflections of light.

It is in fact desirable to reduce stray light from reaching the optical receivers.

An aperture can be provided along the optical path between each optical transmitter and its associated optical receiver. The aperture may then be configured to render the light beam emitted by the optical transmitter specular upon reaching the optical receiver.

Providing an aperture may also further reduce stray light and prevent light from an optical transmitter of reaching the not directly opposing or not associated optical receiver. In addition, rendering the light beam specular allows to reduce interferences between the optical signals at their receipt by the optical receivers.

The apertures can be arranged in an aperture layer, said layer being provided between the first surface and the second surface. The aperture layer can be preferably laminated or attached. The aperture layer may also comprise light absorbing properties.

Such an aperture layer is simple to manufacture and can be easily implemented between the first and second surfaces.

The refractive indexes of the aperture layer and the refractive index of the first and second surfaces can be chosen to minimize total internal reflections of light.

Stray light may thereby be even more reduced.

An optical lens can further be provided for each pair of optical receiver and optical transmitter along the optical path between the optical transmitter and its associated optical receiver. The optical lens may be configured to focus the light beam emitted by the optical transmitter on the optical receiver. The optical lens may also be provided by collimation optics on the optical transmitter.

The optical lenses can also be arranged in a micro lenticular lens. Such an arrangement is simple to implement.

The optical lenses can be provided in the apertures of the aperture layer.

The aperture layer may further have a thickness which is at least the diameter of the apertures such that each aperture is a lightguide funnel for selectively transmitting the specular beam emitted by the optical transmitter towards the optical receiver.

Providing a funnel in between optical receivers and transmitters has the advantage of further reducing stray light within the optical medium and at the entrance of the optical receiver.

Two adjacent optical transmitters are preferably configured to emit a different type of radiation. The opposing optical receiver is then configured to receive the radiation of its associated optical transmitter.

This has the advantage to further reduce unwanted signals from reaching each optical receiver.

For example, an optical receiver can be preferably configured to receive the same spectral bandwidth as its associated optical transmitter.

Two adjacent optical transmitters preferably emit light having a different spectral bandwidth.

An optical transmitter can preferably be configured to transmit light having at least two different spectral bandwidths, and the associated two optical receivers are configured to be sensitive to these two different spectral bandwidths.

The associated optical receiver may also comprise an output per spectral bandwidth, such that an optical receiver may provide additional driving signals.

For example, the optical transmitter may be provided by a white LED emitting red, green and blue light. One optical receiver may then be configured to receive the red, green, and blue components of this optical signal, thereby transmitting three times more information with one optical transmitter. Thus, different wavelengths may be used to modulate different signals.

The sensitivity of the optical receiver can preferably be modulated to selectively react to the incident specular light of the associated optical transmitter.

A neutral density layer can also be provided between the optical transmitter and the optical receiver.

The power of the optical transmitter can further also be reduced to increase the signal to noise ratio at the optical receiver.

All these options provide means to vary the sensitivity and improve the reception of the data signals by the optical receiver. By reducing the power of the transmitter, the noise is also reduced for the not associated optical receivers. The optical receiver can be more selective on the reception of its intended signal. Interference of adjacent stray light is thereby also reduced.

The sensitivity of the optical receiver can also be modulated by adapting the threshold level of the analog signal received by the optical receiver.

This is similar as described above, but at the level of the optical receiver.

The optical receivers are preferably covered by a protective layer to reduce the infiltration of ambient light inside the light emitting module.

Covering the optical receivers enables to reduce contamination by non-desired light coming from stray light or even the display light emitting elements.

The optical transmitters are advantageously covered by a protecting cover to reduce the infiltration of ambient light within the light emitting module.

The optical transmitters and associated optical receivers are preferably arranged to optimize the space on the first and the second surfaces.

The optical transmitters and the optical receivers may therefore be arranged in matrix structure respectively on the first and the second surfaces. An advantage of using optical data transmission is that the optical transmitters and receivers may be provided anywhere on the first and second surface and do need to follow a periodic arrangement. They may be installed where there is sufficient space to accommodate for other specific circuits.

It is to be understood that both the foregoing general description and the following detailed description are exemplary and are intended to provide further explanation of the invention as claimed. Other advantages and features of the invention will be apparent from the following description, drawings, and claims.

BRIEF DESCRIPTION OF DRAWINGS

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

DEFINITIONS AND ACRONYMS

Figures 1A, 1B:
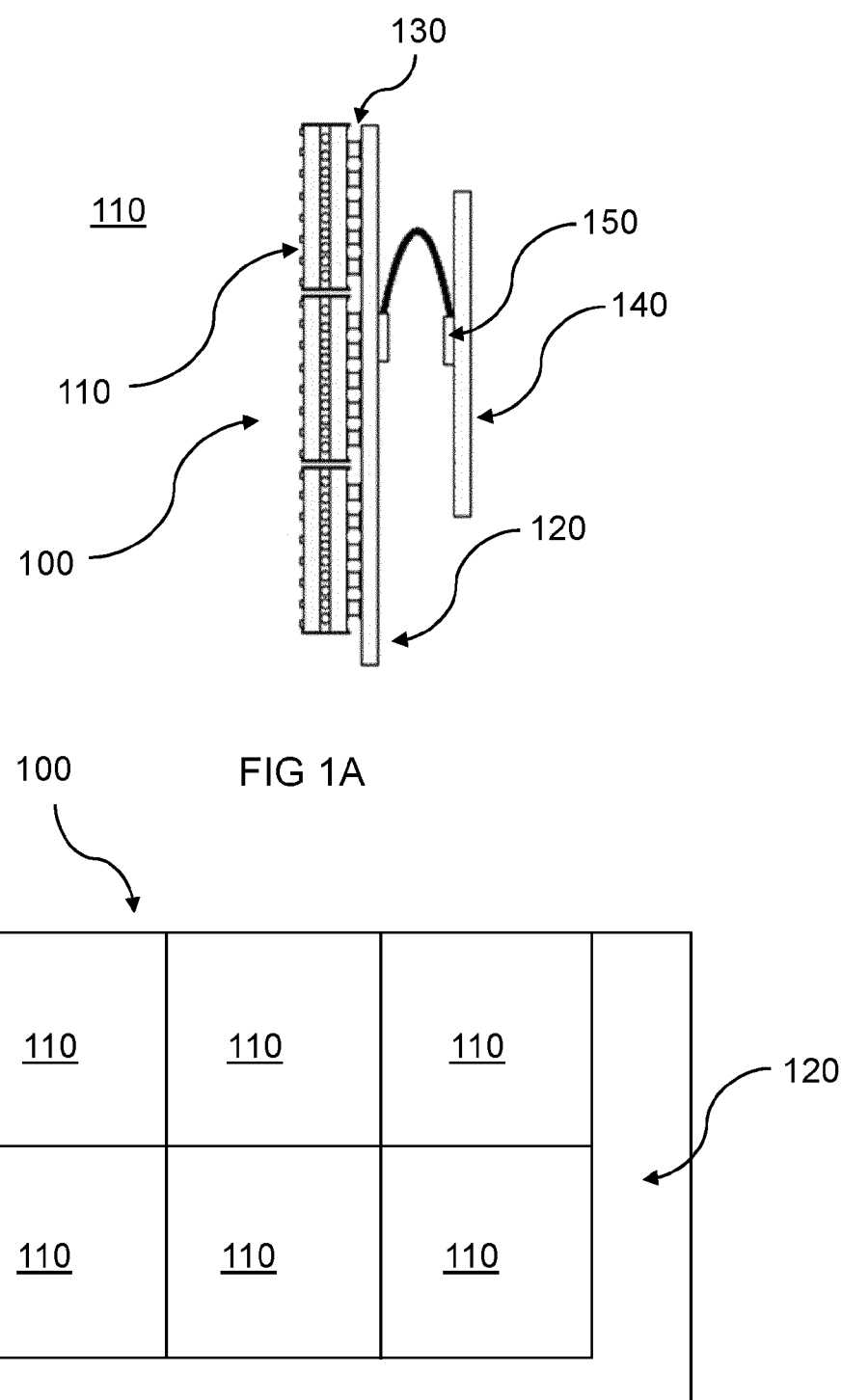
FIG. 1A illustrates a light emitting module for a display fixed to a base carrier.
FIG. 1B illustrates a plurality of light emitting modules provided on a display.

Active Matrix.

Active matrix is a type of addressing scheme used in flat panel displays. In this method of switching individual elements (pixels), each pixel is attached to
a transistor and capacitor actively maintaining the pixel state while other pixels are being addressed.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon, poly-crystalline silicon and is distributed over the entire flat-panel display substrate. An active matrix display can also be for example an LCD or an electrophoretic reflective transmissive emitting display or similar.

A display sub-pixel can be controlled by one control element, and each control element includes at least one transistor. For example, in a simple active-matrix light-emitting diode display, each control element includes two transistors (a select transistor and a power transistor) and one capacitor for storing a charge specifying the luminance of the sub-pixel. Each LED element employs an independent control electrode connected to the power transistor and a common electrode. Control of the light-emitting elements in an active matrix known to the art is usually provided through a data signal line, a select signal line, a power or supply connection (referred to as e.g., VDD) and a ground connection.

Backplane is a board comprising electronic components configured to drive a light emitting display. A backplane can be for example a PCB backplane, or a TFT backplane.

BGA Ball Grid Array

Carrier board refers to a board which is configured to receive at least one display module. It serves as a support structure of a tiled display. The carrier board can be a backplane or a mechanical support structure. It can also serve as a distribution panel for power, ground and distribute the signal to the optical transmitters to program the individual modules. Driving signals or data signals are the signals which comprise the information for driving the light emitting elements to generate an image on the display. Depending in which stage they are in the transmission flow, they may be digital signals, or analog signals, or optical pulse signals, etc.

Display

A display screen can be composed of light emitting pixel structures referred to as "display pixels" or "pixels" where the amount of display pixels determines the "display resolution", sometimes referred to as the "native display resolution" or the "native pixel resolution". A measure of the display resolution can be the total number of display pixels in a display, for example 1920×1080 pixels. Each display pixel can emit light in all colors of the display color gamut (i.e. the set of colors the display is able to provide).

Each display pixel can be composed of light emitting elements referred to as "sub-pixels", often being able to emit the colors red (R), green (G) or blue (B) (but also white, yellow or other colors are possible). A display pixel can be composed of at least three sub-pixels: One red, one green and one blue sub-pixel. Additionally, the display pixel can comprise other sub-pixels in any of the aforementioned colors (to further increase the color gamut). Depending on the types of sub-pixels, the display pixel can then be referred to as a RGB-, RGGB-, RRGB-pixel, etc. While a single display pixel can generate all colors of the display color gamut, a single sub-pixel cannot.

The light emission of a single sub-pixel can be controlled individually so that each display pixel can emit the brightness and color required to form the requested image.

Display module is a module which comprises at least one light emitting module arranged on a carrier. The carrier of the display module is configured to transfer driving signals and power signals to the at least one light emitting module.

A plurality of display modules can be placed on a bigger carrier board (mechanical interface) to create a tiled display and be connected to an external driver or the display module. The functionalities of the driver can also be embedded in the display module.

Duty Cycle The term duty cycle describes the proportion of 'on' time to the regular interval or 'period' of time; a low duty cycle corresponds to low power, because the power is off for most of the time. Duty cycle is expressed in percent, 100% being fully on.

LED. Light Emitting Diode

Light Emitting Element. A light emitting element can be e.g., a solid-state light emitting element, such as a light emitting diode such as an LED or an OLED (Organic LED).

Light Emitting Module

A light emitting module is an opto-mechanical-electronic carrier of a certain size which carries light emitting elements directed towards a viewer and possible light emitting elements driving and control electronics. These light emitting elements are driven to create an image, either static or dynamic (video). In the following the light emitting module will be called an "LED module", although the invention is not restricted to LEDs. Several LED modules or OLED modules can be positioned next to each other to form a display module. Several display modules can be tiled together to form a larger tiled display.

A small LED module which is an atomic element, i.e., indivisible, can be called a "stamp". The light emitting module can have any size and shape. It can be rectangular or square, hexagonal, triangular, any shape, if it fits in a pick and place robot used to place it on a display module. It can also comprise one pixel, which comprises a red, green, and blue LED.

The light emitting module comprises at least one backplane. The top surface of the backplane comprises the light emitting elements and associated conducting tracks which connect the various light emitting elements to various electronic components (like e.g., current drivers, power supply contacts etc.). The backplane can be a PCB, TFT on glass, TFT on PI, etc.

The following patent applications, from the same applicant, provide definitions of LED displays and related terms. These are hereby incorporated by reference for the definitions of those terms.

> U.S. Pat. No. 7,972,032B2 "LED Assembly"
> U.S. Pat. No. 7,176,861B2 "Pixel structure with optimized subpixel sizes for emissive displays"
> U.S. Pat. No. 7,450,085 "Intelligent lighting module and method of operation of such an intelligent lighting module"
> U.S. Pat. No. 7,071,894 "Method of and device for displaying images on a display device".

An Optical path is the path that a light ray follows as it passes through an optical medium or system.

An Optical medium is a material through which electromagnetic waves propagate.

A photosensitive device is a semiconductor device that converts light into an electrical current. The current is generated when photons are absorbed in the device. The devices may contain optical filters, built-in lenses, and may have large or small surface areas.

TGV Through Glass Via

Thin-film technology refers to the use of thin films: A film a few molecules thick deposited on a glass, ceramic, or semiconductor substrate to form for example a capacitor, resistor, coil, cryotron, or other circuit component. A film of a material from one to several hundred molecules thick deposited on a solid substrate such as glass or ceramic or as a layer on a supporting liquid. TFT can be deposited on a substrate such as glass or PI. It comprises multiple layers of wiring, semiconductors, and isolation layers.

DESCRIPTION OF EMBODIMENTS

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The terms "about" or "approximate" and the like are synonymous and are used to indicate that the value modified by the term has an understood range associated with it, where the range can be +20%, +15%, +10%, +5%, or +1%. The term "substantially" is used to indicate that a result (e.g., measurement value) is close to a targeted value, where close can mean, for example, the result is within 80% of the value, within 90% of the value, within 95% of the value, or within 99% of the value.

FIGS. 1A and 1B illustrate a light emitting module 110 for a display 100. The light emitting elements can be any of the light emitting elements provided in the definition section. However, for the sake of clarity, LEDs will be used in the illustrated examples. Thus, an LED display 100 comprising a plurality of LED modules 110 (light emitting module) is hereby shown. FIG. 1A provides a side view of the display, while FIG. 1B provides a front view. Each module 110 is fixed to a carrier 120 through contacting wires 130, which provide mechanical and electrical connection. The carrier may further be connected to an external driver 140 via a flexible connection connected to an external driver connector 150.

The carrier 120 can be a PCB or a TFT backplane with or without driver electronics. In the figure above the base carrier is a TFT backplane which is connected via a flexible connection, such as a flexible PCB to a driver PCB with driver electronics.

Figure 2:
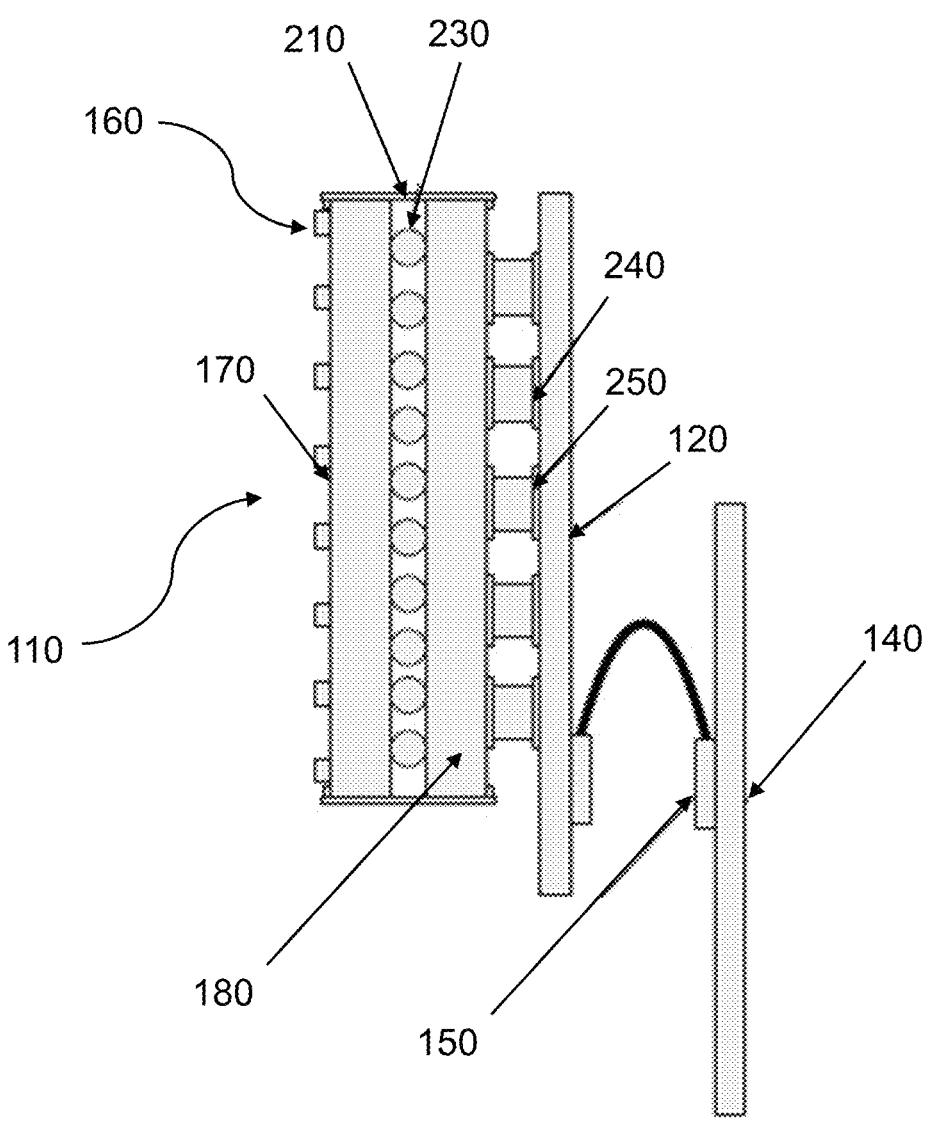
FIG. 2 is a closer view of the light emitting module of FIG. 1A.

FIG. 2 illustrates a closer view of an LED module 110. In this example, the LED module comprises a first 170 and a second 180 TFT backplane. The first and the second backplanes could also be PCBs. Thus, any combination of front/back TFT backplane/PCB backplane are possible. The present example is illustrated with TFT backplanes.

The connection from the first 170 to the second 180 backplanes can be done with a contact strip 210 on the edges. These contact strips on the edges replace the vias in a single stack up led module. The balls 230 between the two TFT backplanes are spacers to control the distance between the two TFT backplanes. This LED module 110 is also connected to a carrier 120 through connections 240. Here, in this example, the carrier 120 is a PCB. After assembly, both the first and second TFT glasses are glued together with spacers in between to maintain planarity and parallelism between the first and second TFT glass.

Figure 3A:
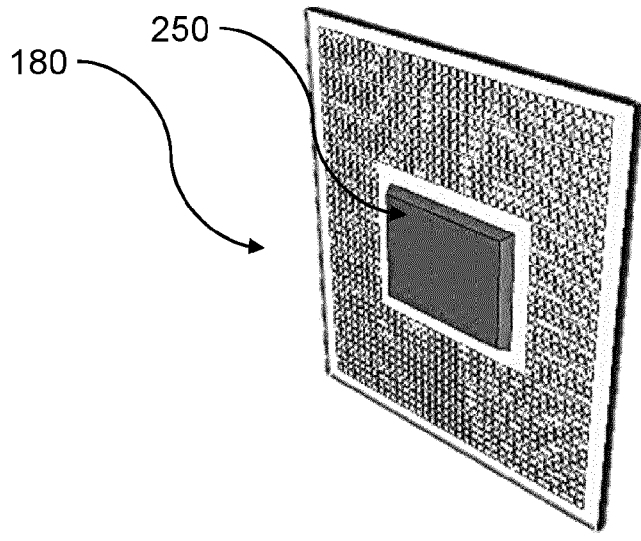
FIG. 3A illustrates the second surface of an LED light emitting module with its electronics.
Figure 3B:
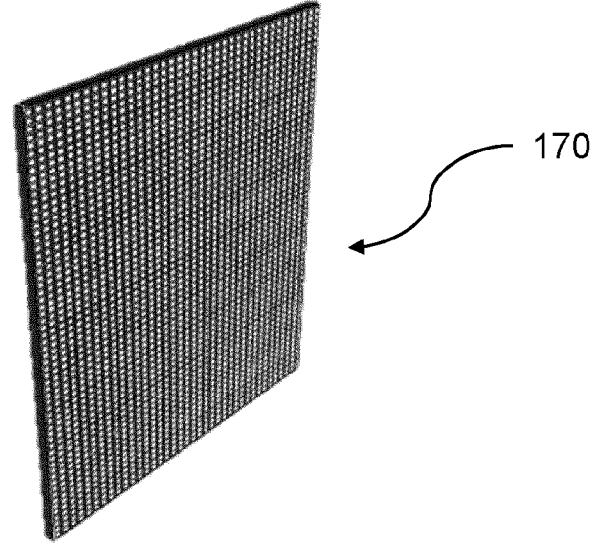
FIG. 3B illustrates the first surface of a light emitting module, wherein the light sources are LEDs.

FIGS. 3A and 3B further illustrate respectively the second 180 and the first 170 TFT backplanes of an LED module. The first TFT backplane comprises the LEDs and TFT electronics and functions. The second TFT backplane comprises TFT electronics, possible discrete mounted semiconductor electronics and contacting array 250 to contact to the carrier 120.

Figure 4:
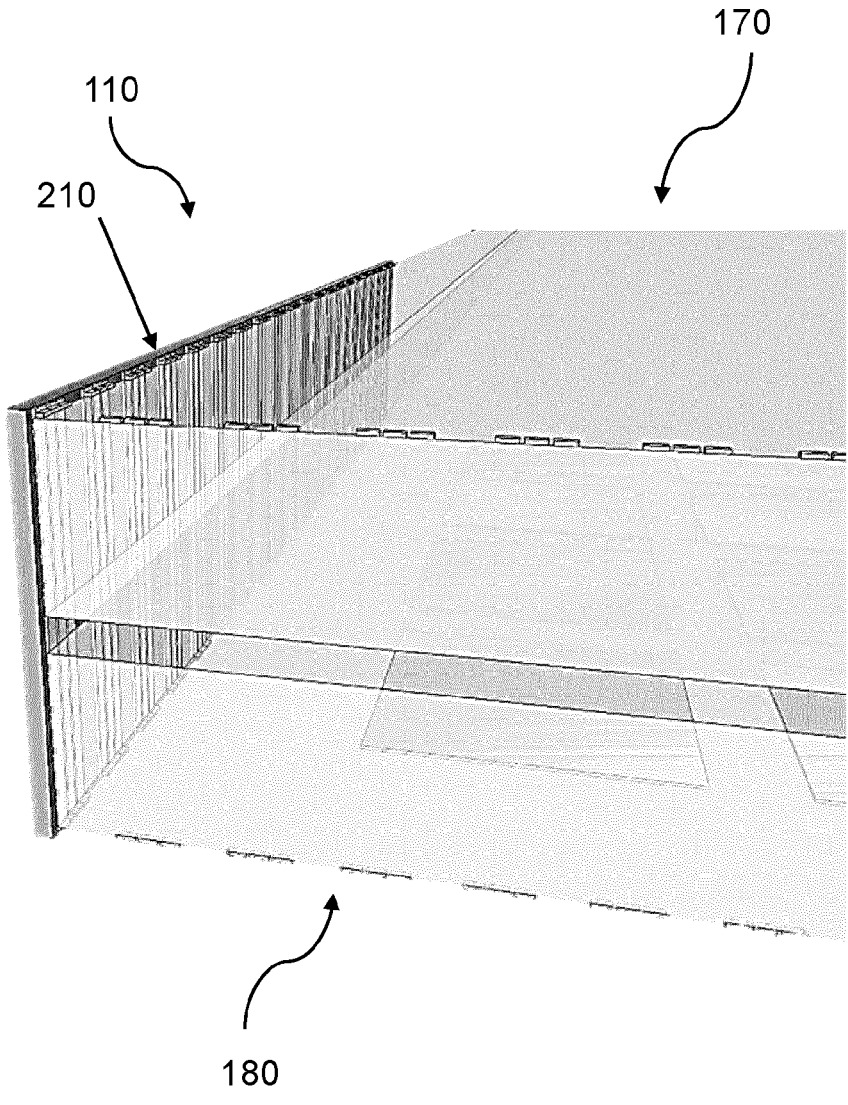
FIG. 4 illustrates the first and second surfaces of an LED module assembled in stack up, wherein all the connections are provided in the rim of the module.

As further illustrated in FIG. 4, the connection between the first and the second TFT backplanes requires a large amount of side contacts 210, i.e., a galvanic connection, at the edge joining both the first and second TFT backplanes.

Figure 5A:
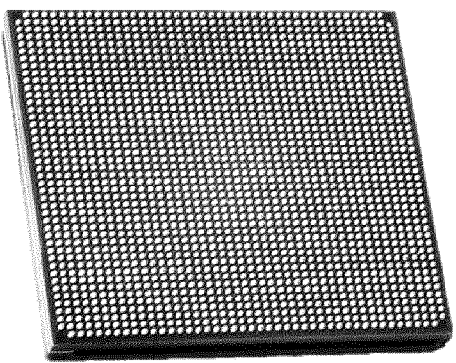
FIG. 5A illustrates a ball grid array which is used to connect a light emitting module to a base carrier, according to the prior art.
Figure 5B:
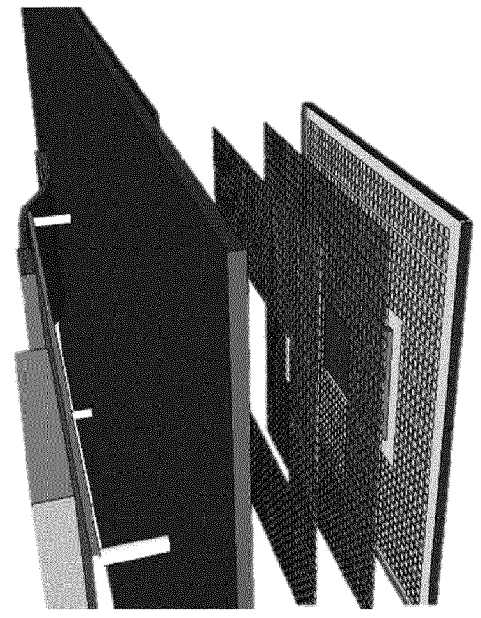
FIG. 5B illustrates the different layers in exploded view of a LED module and a base carrier.

The LED module with side connections is then mounted onto a carrier, as shown in FIG. 5B. The contacting to the base carrier of the light emitting module may be done through FPC or in-plane contact array (similar to a ball grid array, as shown in FIG. 5A).

It is an object of the present invention to replace the amount of side contacts 210 illustrated in FIG. 4 between the first and second TFT backplanes. As will be explained later, instead of a first and second backplanes we will refer to a first and second surface throughout the description.

Instead of using a galvanic connection to transmit data signals from the second surface to the first surface, the inventors have developed a system for transmitting the data signals optically to the light emitting elements provided on the first surface of the light emitting module of a light emitting module. To achieve this optical data transmission, the light emitting module comprises optical receivers provided on the first surface and associated optical transmitters arranged on the second surface, such that an optical signal transmitted by the optical transmitter is received by the associated optical receiver and transformed into driving signals for the light emitting elements. Each optical receiver is therefore connected to at least one light emitting element and is configured to transform said optical signal into an electrical signal configured to drive the at least one light emitting element to generate an image on the display.

Therefore, optical transmitters and receivers should preferably work in a pair. Throughout the description it is referred to an optical transmitter and its corresponding or associated optical receiver. On the contrary, if an optical transmitter/receiver are not configured to work in a pair, it can be referred to as not associated, or not corresponding optical receiver/transmitter.

In TFT technology for example, there is the possibility to implement an element called an Optical Photosensitive Device (OPD), i.e., a photodiode. Such photodiodes are known by the skilled person and are easily implemented in the TFT technology (e.g., LTPS, IGZO, a-Silicon). These photodiodes are usually used for capturing fingerprints. The photodiode or OPD can be freely combined with other circuits on the TFT glass.

Figure 6A:
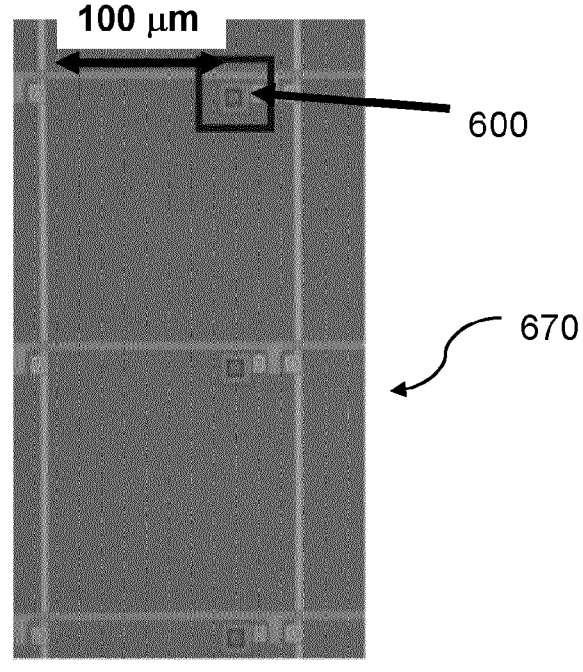
FIG. 6A shows an OPD on a TFT backplane.

An advantage is that the OPD can be designed with different spectral sensitivities. For example, the OPD can be designed to capture light only in the visible range (425-650 nm), or in any specific wavelengths range. The OPD can be directed for measurement outbound or inbound. An example of such an OPD arranged on a TFT glass backplane is illustrated in FIG. 6A. The OPD can be very compact (7 $\mu$m×5 $\mu$m) and hence fits easily in between other circuits on the TFT glass.

It is the aim of the invention to use an optical receiver such as an OPD. As illustrated in FIG. 6A, the OPD 600 is embedded in the first surface 670, to receive an optical signal from an optical transmitter. The OPD 600 is in this case arranged to be looking inwards from the first surface 670 towards a second surface, facing the optical transmitters arranged on a second surface, as illustrated in FIG. 7.

Figure 7:
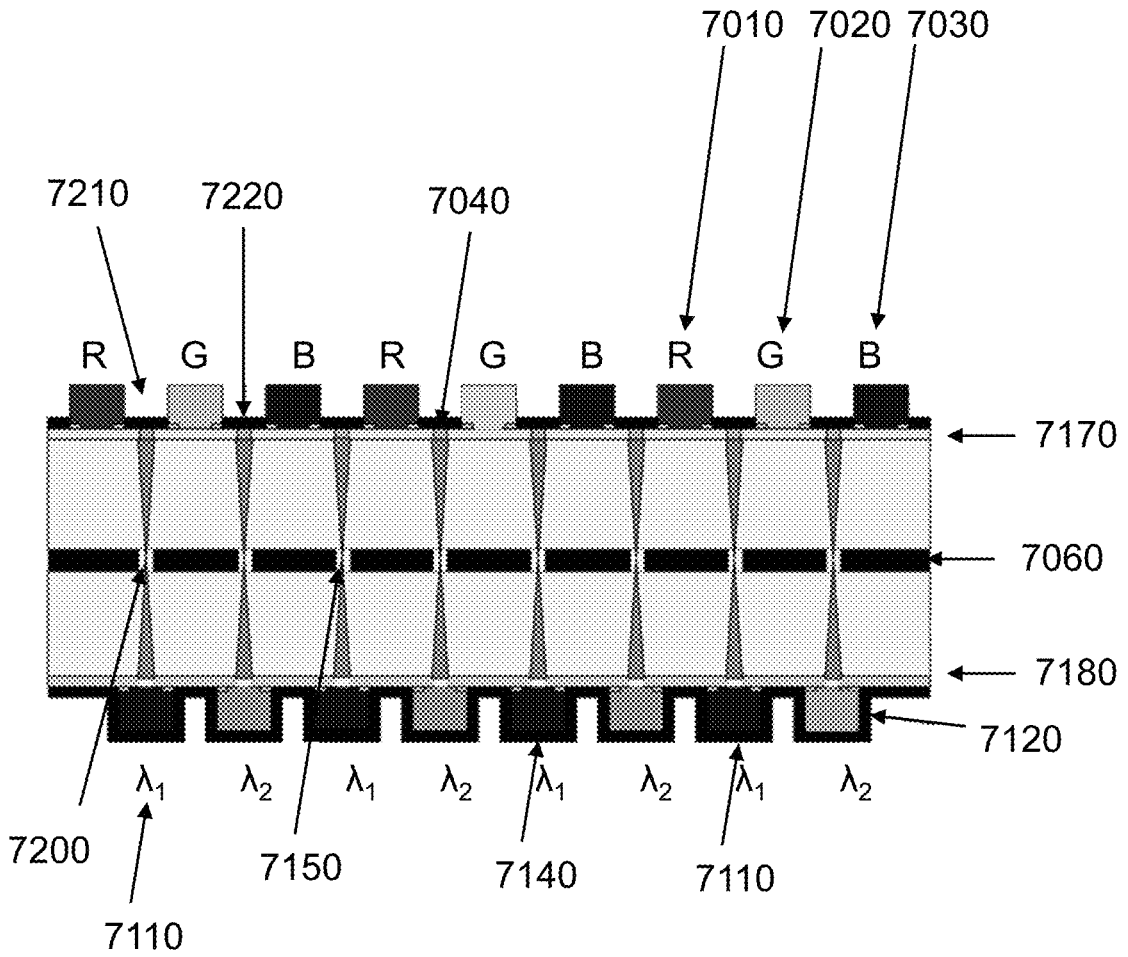
FIG. 7 is a side view of a light emitting module having a first and a second surface provided by TFT backplanes, a series of optical emitters and their associated optical receivers to transfer the electrical signals to the display light emitting elements.

FIG. 7 shows a cross section of a light emitting module 7000. A plurality of optical transmitters 7110, 7120 are provided on a first surface 7170. Opposing optical receivers 7210, 7220 are provided on a second surface 7180. Each optical receiver 7210, 7220, is connected to a least one light emitting elements 7010, 7020, 7030.

The optical signal emitted by the optical transmitter can be a pulsed optical signal. The pulsed optical signal transmitted by the emitters on the second surface 7180 is received as a light pulse of a certain wavelength (or wavelength range) and is directly converted to an electrical signal which is then further processed in the first surface 7170 electronics to drive the light sources of the first surface and generate an image on the display with the light emitting elements.

The optical transmitters arranged on the first surface can be any light emitting elements as defined above, for example LEDs, or any type thereof Milli-LED, Micro-LED, OLED, EL, lasers, etc. LEDs have the advantage of being a point light source, being very compact, energy efficient, etc.

In FIG. 7 the light emitting elements are provided by red (R) 7010, green (G) 7020 and blue (B) 7030 micro-LEDs. The first surface 7170 and the second surface 7180 are both in this example TFT glass. Furthermore, the optical transmitters are embodied by micro LEDs 7110, 7120.

As mentioned above, the first surface 7170 and the second surface 7180 can be for example a backing TFT glass, but also a PCB. An advantage of using a backing TFT glass for the first surface and the second surface is that the medium between the optical transmitters and optical receivers (OPD) is an optical medium, i.e., glass. However, the invention is not restricted to TFT glass, as it is possible to provide an optical medium between the transmitter and the receiver with other types of first and second surfaces. A PCB with holes at the locations of the receivers/transmitters could also be used as an optical medium wherein the optical transmitters would be provided on the bottom layer, and the optical receivers on the upper layer.

Driving circuitry connected to or embedded on the second surface 7180 or even on possible external driver boards is configured to transmit driving data to the second surface 7180, which further processes the digital data train and then modulates the optical transmitters, i.e., the micro-LEDs. The electrical signal is converted to an optical signal. The optical signal is transmitted as an optical pulse to reach the opposing associated optical receivers, OPDs. The signal triggers the photosensitivity of the OPD as from a certain threshold (see FIG. 6B). The OPD 7210, 7220 then transforms the optical signal back into an electrical signal for further processing on the Front TFT Glass 7170 and for driving the light emitting elements, i.e., micro-LEDs. In this way, an optical data transfer between the second surface 7180 and the first surface 7170 is established.

Figure 6B:
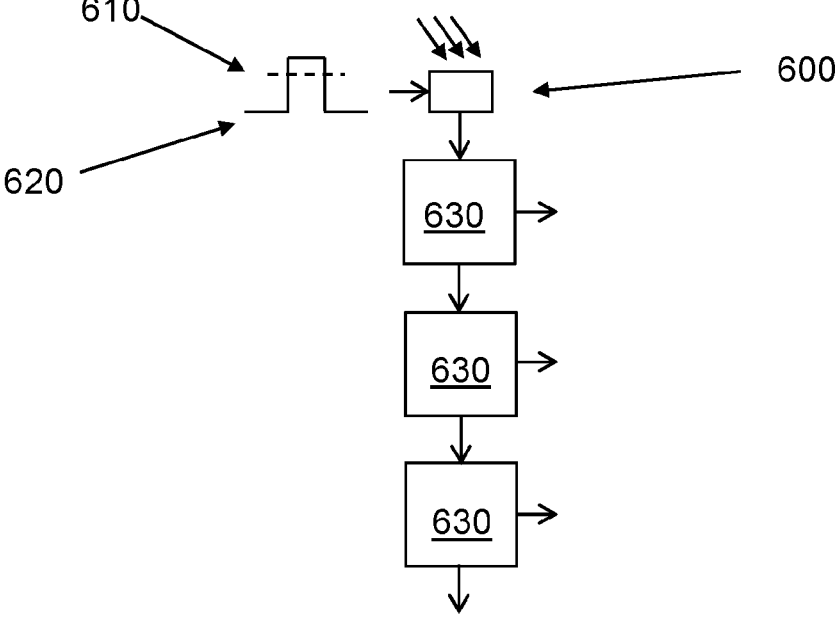
FIG. 6B is a schematic representation showing the application of a threshold to the analog signal transmitted by the optical transmitters, to generate a digital signal, to be fed to the light emitting elements.

In FIG. 6B, the optical signal is received as an optical pulse 620, which is converted to a digital binary signal after the application of a threshold 610 in driver 600. The digital signal is then fed to various electronic elements 630 to finally reach the light emitting elements as a driving signal to generate an image on the display.

This digital data stream is equivalent to what is normally transmitted through the galvanic connections at the sides.

As shown in FIG. 6A, wherein OPD 600 is illustrated on a TFT substrate, the OPDs may be arranged anywhere on the substrate are not required to follow a periodic configuration, or be arranged in rows and columns, for example. This provides additional flexibility with respect to the use of galvanic connections, which requires a certain pitch when being arranged on a substrate for example. Thus, the optical receivers and associated transmitters can be arranged anywhere on the surface where there is space and can be randomly distributed. The only constraint is that two optical receivers are preferably not too close to one another to avoid interference.

The number of optical transmitters and associated optical receivers is determined by the number of data signals to transmit.

Using such an optical transmission for all data signals, the only galvanic coupling which may remain between the first and second surface are the Power, the Ground and the reference voltages required to operate the light emitting module. These connections may still need to fit in the gap between adjacent light emitting modules when assembled, however the requirements are less stringent as the space available for these galvanic connections is dramatically increased. These connections may be therefore wider and distributed over the rim of the light emitting module with less constraints.

To secure the integrity, the quality, and the reliability of the transmission from the optical emitter to the optical receiver, the following measures can additionally be provided.

As the optical transmitters 7110, 7120 emit a Lambertian radiation, there is the possibility that the light emitted by an optical transmitter is transmitted to more than the associated optical receiver, i.e., OPD, and thereby distorts the signals received by other OPDs.

To reduce signal cross talk, a pinhole 7200 or aperture 7200 can be provided along the optical path between the optical transmitter 7110, 7120 and the optical receiver 7210, 7220, as illustrated in FIG. 7. This pinhole 7200 filters a portion of the Lambertian radiation emitted by the optical transmitter, i.e., micro-LED. These pinholes can be implemented as a pinhole aperture layer 7060 laminated between the first 7170 and second 7180 surfaces of the light emitting module.

The apertures (or pinholes) should fit in the dimensions of the contact pads or fit between the LEDs. Thus, the apertures should have a diameter of at most 50 μm.

The aperture layer sheet is sandwiched between the first and the second surfaces, as shown in FIG. 7. The aperture layer is a sheet comprising a matrix of apertures/pinholes, each aperture being dedicated to a pair of optical transmitter/optical receiver.

As a result, the light emitted by the optical transmitter 7110, 7120, i.e., micro-LEDs, is a specular beam. The light coming from the transmitting LEDs will be more prominently present at the associated OPD and wide stray light is decreased.

Figures 8A, 8B:
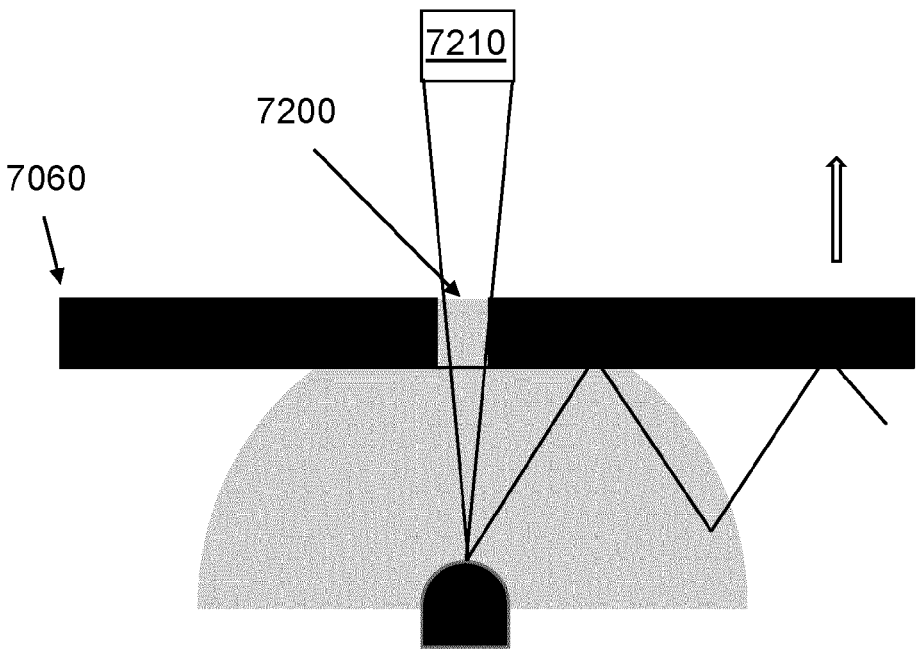
FIG. 8A is a schematic representation illustrating the Lambertian emission of the LED optical transmitter, wherein an aperture layer is provided to render the light beam specular upon reaching the optical receiver.
FIG. 8B is a schematic representation of the apertures having a thickness such that the optical signal emitted by the optical transmitter travels in a funnel upon reaching the optical receiver.

Decreasing the Lambertian radiation and allowing specular light to propagate from back to front, strongly reduces the bouncing of the light due to TIR (Total Internal Reflection) in the optical medium, which is a glass medium for example in the case where the first and second surfaces are TFT glass. TIR is generated if the angular incidence of the light occurs over a certain angle, determined by the refractive index of the optical medium and its adjacent medium, e.g., air. At these critical angles, the transition surface between the optical medium, e.g., glass surface and the adjacent medium works as a mirror and will propagate the light beams further into the medium as stray light, which is uncontrollable. Stray light of an adjacent emitter might fall in a non-associated OPD, triggering a false pulse. The apertures or pinholes 7200 on all levels will strongly decrease the propagation of uncontrolled straylight and will hence improve the integrity of the data transmission, as shown in FIGS. 8A and 8B.

Straylight generated by TIR can also be reduced by optimizing the aperture layer for maximum absorption of the emitted light outside the OPD aperture.

Furthermore, the aperture layer can be attached or laminated to the glass surface and the refractive indexes of the aperture layer can be matched with the refractive index of the first surface and the second surface. This maximizes absorption of non-apertured light into the aperture layer and hence minimizes TIR in the glass medium, as illustrated in FIGS. 8A and 8B.

The light emitting elements may further be provided with pre-collimating optics, thereby reducing undesirable side radiation with simple collimation.

The light emitted by the optical transmitters may further be focused on the optical transmitters by means of an optical lens (e.g., a micro-lens collimation or condenser lens) provided in the optical path between the optical transmitter and its associated optical receiver. The optical lens may be arranged in a micro lenticular lens provided between the first and second surface. For example, the optical lens may also be arranged within each aperture 7150 of the aperture layer 7060, provided between the first surface and the second surface of the light emitting module.

Advantageously, by increasing the thickness of the aperture layer to for example at least the diameter of the apertures, as shown in FIG. 8B, a lightguide funnel 810 is automatically created, thereby transmitting selectively the specular light emitted by the optical transmitter towards the associated optical receiver. This light funnel absorbs incident light entering the funnel under a variety of angles. This improves the reliability of the optical transfer by decreasing the influence of stray light within the medium of the first surface and the second surface, i.e., Front TFT Glass and the Backing TFT Glass.

In parallel or alternatively, to increase the efficiency of detection, two adjacent optical transmitters can be of a different kind or emit a different type of radiation. For example, two adjacent LEDs 7110, 7120 can be configured to emit different wavelengths $\lambda_1$, $\lambda_2$, as illustrated in FIG. 7. The corresponding OPDs at the receiving end can also be made selective to the associated transmitting LEDs. Hence, a pair of optical receiver/optical transmitter will be less sensitive to the crosstalk of adjacent optical transmitters/optical receivers due to the wavelength selectivity of the emitter and the receiver.

Thus, each optical receiver may be configured to receive the same spectral bandwidth as its associated optical transmitter. In addition, two adjacent optical transmitters may emit light having a different spectral bandwidth such that the associated optical receivers receive the dedicated spectral bandwidth.

It is also possible to provide an optical transmitter which is configured to emit light having at least two different spectral bandwidths. For example, a white LED (comprising three LEDs) and emitting a red, a green and a blue component. An optical receiver may then be adapted to receive each of the emitted components. This way, additional signals may be transmitted by one transmitter. Thus, different wavelengths may be used to modulate the signals transmitted by the optical transmitters. The optical receiver may further comprise an output for each component received.

The transmitter may advantageously be provided by a 3-in-1 LED (R, G, B) where the three wavelengths are combined to one color, depending on the content of R, G and B.

The receiver can be wavelength selective and breaking the information into a R, G and B channel.

It may be advantageous to further provide an optical transmitter which transmits light outside of the visible spectrum, and optical receivers configured to be sensitive to these wavelengths accordingly. For example, the optical transmitter may be embedded by a UV micro LED and the associated optical receiver by a UV photodiode. A similar example could be provided with IR. This is advantageous as the optical receivers would not be sensitive to the light emitted by the display, and the light emitted by the optical transmitters would not disturb the image emitted by the display.

The reliability of the optical data transmission can further be improved by modulating the sensitivity of the OPD to react more selectively to the incident specular light from the associated optical transmitter and less to the residual stray light coming from different not associated optical transmitters, from which light might also propagate in the glass medium, by TIR, in the first surface (e.g., TFT Glass) and the second surface (e.g., TFT Glass). This can be realized by providing a neutral density layer between the OPD and the incident receiving light. A similar effect can be achieved by adjusting the power of the optical transmitters.

Furthermore, the OPD sensitivity can be adjusted by modulating the electrical threshold 610 or trigger level of the analog signal 620 coming from the OPD 600 itself, as shown in FIG. 6B.

In addition to the above improvements, it is also desirable to shield the interior of the light emitting module from stray light such as ambient light but also from the light emitted by the display itself.

In fact, in most cases, the displays are RGB emissive displays whose light is emitted in close proximity to the OPDs themselves. It is thus preferable to shield the interior of the light emitting module from visible light to avoid interference with the optical elements of the display. Different possibilities exist to avoid straylight.

The optical receivers, i.e., the OPDs 2040 may preferably be protected from incident light coming from the environment (e.g., incident light at the front of the display) as well as light coming from the Display LEDs. The OPDs 2040 can be covered by a protective layer which may be integrated with the secondary optics of the Light emitting module, or with a separate specific screen 7140 which covers and protects the optical receivers directly, as shown in FIG. 7.

The secondary optics can be for example provided by an extra optical layer provided on top of the LEDs. This extra layer (or secondary layer) may hold extra optical functions such as anti-reflection patterns, contrast enhancement solutions, etc.

The optical transmitters may also be more compartmented by adding a protective cover 7120 on top of the transmitting LEDs, preferably in a non-transmissive material or layer, as illustrated in FIG. 7.

While the invention has been illustrated with TFT on Glass for the first and second surfaces, the same effects may be achieved with any type of backplane having single sided circuitry. For example, non-glass carriers for the first and second surfaces may be used such as FR4 PCB material, or ceramic material. It is also possible to use TFT on Polyimide (PI). In case non-transparent materials are used, pinholes or funnels between the optical emitters and their associated optical receivers may need to be arranged within the medium to provide an optical medium for the light to travel from the optical emitter to its associated optical receiver.

It is advantageous to apply the teachings of the present invention when a large amount of data signals is to be transferred.

While the invention has been described with OPDs, the advantageous effects of using OPDs may also be achieved with discrete OPD devices (e.g., semiconductor photovoltaic elements).

Modifications

It will be appreciated that various modifications may be made to the embodiments hereinbefore described. Such modifications may involve equivalent and other features which are already known in the design, manufacture and use of the light emitting module and component parts thereof and which may be used instead of or in addition to features already described herein. Features of one embodiment may be replaced or supplemented by features of another embodiment.

The same principles can be realized with other technologies than optical radiation. For example, the same principles can be applied to acoustic wave, with the use of piezo transducers for emission and reception, as well as with inductive emitters and receivers (e.g., RF).

The present invention is not limited to light emitting modules for displays, it can further be applied to any application in which data needs to be transferred from a first surface to a second surface. The second surface needs to comprise a plurality of optical transmitters and the first surfaced needs to comprise a plurality of optical receivers, each optical receiver being associated to an associated optical transmitter, and wherein an optical medium further can be provided between each pair of optical receiver and transmitter. Thus, instead of transmitting the data to light emitting elements for generating an image on the display, other types of devices, than the light emitting elements, may be used.

In addition, instead of transmitting the data to a plurality of light emitting elements, it would be possible to use these optical means to transfer data which has been acquired by a sensor for example. The sensors would thus be implemented on the second surface, in proximity to the optical transmitters such that the acquired data would then be transferred by the optical transmitters to associated optical receivers, which would then further transfer this data to a base carrier, or any other processing means. The sensors could be for example a photodiode, a photovoltaic, photoconductive devices, photo transistor, etc. This could be used in applications such as contactless optical sensing of fingerprint, face recognition cameras, heat sensing (IR sensing), iris/eye recognition, biometrical applications, Vein matching, (vascular technology), etc.

In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. Where one claim refers to another claim, this may indicate synergetic advantage achieved by the combination of their respective features. But the mere fact that certain measures are recited in mutually different claims does not indicate that a combination of these measures cannot also be used to advantage. The present embodiments may thus include all working combinations of the claims wherein each claim can in principle refer to any preceding claim unless clearly excluded by context.

While the invention has been described hereinabove with reference to specific embodiments, this was done to clarify and not to limit the invention. The skilled person will appreciate that various modifications and different combinations of disclosed features are possible without departing from the scope of the invention.

The invention claimed is:

1. A light emitting module comprising:

a first surface comprising a plurality of light emitting elements, a second surface configured to receive driving signals and to transfer these signals to the light emitting elements of the first surface, wherein the second surface comprises a plurality of optical transmitters, wherein the optical transmitters are each associated to an opposing optical receiver arranged on the first surface, the optical transmitter and the associated opposing optical receiver being separated by an optical medium, such that an optical signal comprising driving signals transmitted by the optical transmitter is received by the associated opposing optical receiver, each optical receiver being connected to at least one light emitting element and is configured to transform said optical signal into an electrical signal configured to drive the at least one light emitting element to generate an image for a display.

2. The light emitting module according to claim 1, wherein the optical receiver is an optical photosensitive device.

3. The light emitting module according to claim 1, wherein the optical transmitter is a light emitting element, wherein said light emitting element is an LED, OLED, QD-LED, EL-QLED, AMOLED, mini-LED, micro-LED, or a laser.

4. The light emitting module according to claim 1, wherein the light emitting elements are any one of LEDs, OLEDs, QD-LEDs, EL-QLEDs, AMOLEDs, mini-LEDs, or micro-LEDs.

5. The light emitting module according to claim 1, wherein the first surface and/or the second surface is a Thin Film Transistor (TFT) on glass, TFT on polyimide, a Printed Circuit Board (PCB).

6. The light emitting module according to claim 1, wherein refractive indexes of the first and second surfaces are chosen to minimize total internal reflections of light.

7. The light emitting module according to claim 1, wherein an aperture is provided along the optical path between each optical transmitter and its associated optical receiver, said aperture being configured to render the light beam emitted by the optical transmitter specular upon reaching the optical receiver.

8. The light emitting module according to claim 7, wherein the apertures are arranged in an aperture layer, said layer being provided between the first surface and the second surface, wherein the aperture layer is preferably laminated or attached, and/or wherein the aperture layer preferably comprises light absorbing properties.

9. The light emitting module according to claim 8, wherein refractive indexes of the aperture layer and the refractive index of the first and second surfaces are chosen to minimize total internal reflections of light.

10. The light emitting module according to claim 8, wherein the aperture layer has a thickness which is at least a diameter of the apertures such that each aperture is a lightguide funnel for selectively transmitting the specular beam emitted by the optical transmitter towards the optical receiver.

11. The light emitting module according to claim 1, wherein an optical lens is provided for each pair of optical receiver and optical transmitter along the optical path between the optical transmitter and its associated optical receiver, said optical lens being configured to focus the light beam emitted by the optical transmitter on the optical receiver.

12. The light emitting module according to claim 11, wherein the optical lenses are arranged in a micro lenticular lens.

13. The light emitting module according to claim 11, wherein the optical lenses are provided in the apertures of the aperture layer.

14. The light emitting module according to claim 1, wherein two adjacent optical transmitters are configured to emit a different type of radiation and the associated optical receiver is configured to receive the radiation of its associated optical transmitter.

15. The light emitting module according to claim 14, wherein an optical receiver is configured to receive the same spectral bandwidth as its associated optical transmitter.

16. The light emitting module according to claim 15, wherein two adjacent optical transmitters emit light having a different spectral bandwidth.

17. The light emitting module according to claim 14, wherein an optical transmitter is configured to transmit light having at least two different spectral bandwidths, and the associated optical receiver is configured to be sensitive to these two different spectral bandwidths.

18. The light emitting module according to claim 17, wherein the associated optical receiver comprises an output per spectral bandwidth.

19. The light emitting module according to claim 1, wherein sensitivity of the optical receiver is modulated to selectively react to the incident specular light of the associated optical transmitter.

20. The light emitting module according to claim 19, wherein a neutral density layer is provided between the optical transmitter and the optical receiver.

21. The light emitting module according to claim 19, wherein the power of the optical transmitter is reduced to increase the signal to noise ratio at the optical receiver, or wherein the sensitivity of the optical receiver is modulated by adapting the threshold level of the analog signal received by the optical receiver.

22. The light emitting module according to claim 1, wherein the optical receivers are covered by a protective layer to reduce the infiltration of ambient light inside the light emitting module, or wherein the optical transmitters are covered by a protecting cover to reduce the infiltration of ambient light within the light emitting module, or wherein the optical transmitters and associated optical receivers are arranged to optimize the space on the first and the second surfaces.

* * * * *